(12) United States Patent
Takahashi

(10) Patent No.: US 7,834,401 B2
(45) Date of Patent: Nov. 16, 2010

(54) SEMICONDUCTOR DEVICE AND FABRICATION METHOD FOR THE SAME

(75) Inventor: Nobuyoshi Takahashi, Toyama (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 12/369,283

(22) Filed: Feb. 11, 2009

(65) Prior Publication Data
US 2009/0256232 A1    Oct. 15, 2009

(30) Foreign Application Priority Data
Apr. 15, 2008    (JP)    ............... 2008-105642

(51) Int. Cl.
*H01L 23/62* (2006.01)
(52) U.S. Cl. .............. 257/360; 438/689; 257/328
(58) Field of Classification Search ............ None
See application file for complete search history.

(56) References Cited

U.S. PATENT DOCUMENTS

| | | | |
|---|---|---|---|
| 4,554,729 A * | 11/1985 | Tanimura et al. | 438/210 |
| 5,148,255 A * | 9/1992 | Nakazato et al. | 257/378 |
| 5,324,982 A * | 6/1994 | Nakazato et al. | 257/546 |
| 5,386,135 A * | 1/1995 | Nakazato et al. | 257/369 |
| 5,904,518 A * | 5/1999 | Komori et al. | 438/201 |
| 6,020,643 A * | 2/2000 | Fukuzumi et al. | 257/774 |
| 6,300,194 B1 | 10/2001 | Locati et al. | |
| 6,831,316 B1 * | 12/2004 | Matsuoka et al. | 257/296 |
| 6,869,844 B1 | 3/2005 | Liu et al. | |
| 6,987,036 B2 | 1/2006 | Hamatani et al. | |
| 7,439,591 B2 * | 10/2008 | Kang | 257/360 |
| 2004/0014323 A1 * | 1/2004 | Shimizu | 438/694 |
| 2004/0202041 A1 * | 10/2004 | Hidenori | 365/233 |
| 2007/0111408 A1 | 5/2007 | Arao | |
| 2008/0265236 A1 * | 10/2008 | Lee et al. | 257/3 |

FOREIGN PATENT DOCUMENTS

JP    2000-332139    11/2000

* cited by examiner

*Primary Examiner*—Jarrett J Stark
*Assistant Examiner*—Nicholas Tobergte
(74) *Attorney, Agent, or Firm*—McDermott Will & Emery LLP

(57) ABSTRACT

The semiconductor device includes: memory cells each having a first multilayer electrode including a first lower electrode made of a first conductive film and a first upper electrode made of a second conductive film formed one on the other with a first interface film therebetween; and a diode having a diode electrode made of the second conductive film and a second interface film as a silicon oxide film formed at the interface between the diode electrode and a substrate. The first interface film has a thickness with which electrical connection between the lower electrode and the upper electrode is maintained, and the second interface film has a thickness with which epitaxial growth between the substrate and the diode electrode is inhibited.

6 Claims, 6 Drawing Sheets

SEMICONDUCTOR DEVICE AND FABRICATION METHOD FOR THE SAME

CROSS-REFERENCE TO RELATED APPLICATIONS

This application claims priority under 35 U.S.C. §119 on Patent Application No. 2008-105642 filed in Japan on Apr. 15, 2008, the entire contents of which are hereby incorporated by reference.

BACKGROUND OF THE INVENTION

The present invention relates to a semiconductor device and a fabrication method for the same, and more particularly to a semiconductor device having memory cells and diodes for protection and a fabrication method for the same.

Structures having diffusion bit lines and word line electrodes orthogonal to the diffusion bit lines are essential for miniaturization of memory cells. In particular, a structure having bit line insulating films formed on diffusion bit lines by chemical vapor deposition (CVD), not by thermal oxidation, is superior to others in the effect of miniaturizing memory cells. As an example of a method of forming bit line insulating films by CVD, a method is disclosed in which word line electrodes are provided as multilayer electrodes each composed of a lower electrode and an upper electrode both made of polysilicon and the like. In this method, bit line insulating films can be embedded after diffusion bit lines is patterned using a polysilicon film that is to be lower electrodes as a mask (see Japanese Laid-Open Patent Publication No. 2000-332139, for example).

With the progress in miniaturization of memory cells, protection of memory cells from in-process charging has become increasingly important. For this reason, formation of diodes for protection together with memory cells has been examined.

Providing word line electrodes as multilayer electrodes has a merit that diodes for protection can be easily formed. To state more specifically, openings exposing the substrate may be formed using the polysilicon film that is to be lower electrodes as a mask, so that a polysilicon film that is to be upper electrodes can be in direct contact with the substrate via the openings, to thereby form diodes each having a diode electrode directly coupled with the substrate.

SUMMARY OF THE INVENTION

However, the inventors of the present invention have found that the conventional structure having word line electrodes provided as multilayer electrodes described above has the following problems.

In a multilayer word line electrode, the lower electrode and the upper electrode must be electrically connected with each other at the interface thereof. It is ideal for the lower and upper electrodes to be in direct contact with each other. In a normal semiconductor process, however, an oxide film is formed by natural oxidation at the interface between the lower electrode and the upper electrode and the interface between the substrate and the diode electrode.

Such an oxide film formed by natural oxidation is so thin that the electrical connection between the lower electrode and the upper electrode and the electrical connection between the substrate and the diode electrode can be secured. However, variations in the thickness of the oxide film may cause variations in the threshold voltage of the transistor and variations in the resistance of the multilayer polysilicon.

In formation of a protection diode, a polysilicon film must be formed on the substrate. In this case, to ensure that no abnormal epitaxial growth will occur between the substrate and the diode electrode, an oxide film having at least some degree of thickness should preferably be formed between the substrate and the diode electrode.

From the above, it is found that the thickness of the oxide film between the lower electrode and the upper electrode and the thickness of the oxide film between the substrate and the diode electrode are in a trade-off relationship. Hence, a thin oxide film whose thickness is uniform and precise must be formed between the lower electrode and the upper electrode and between the substrate and the diode electrode.

It is however difficult to control the thickness of a natural oxide film. To overcome this, an extremely thin oxide film may be formed on the lower electrode and on the exposed portion of the substrate by thermal oxidation or CVD. Formation of an oxide film by thermal oxidation has a problem that the thermal budget increases causing a variation in element characteristics, and also increases the number of process steps. Formation of an oxide film by CVD has problems that control of the film thickness is difficult and that the film thickness becomes several nanometers at the minimum causing degradation in the drive capability of elements. This also increases the number of process steps as in the case of thermal oxidation.

The present disclosure is providing a semiconductor device in which an oxide film having a uniform and optimal thickness is formed at the interface between a lower electrode and an upper electrode of a memory cell and the interface between a substrate and a diode electrode of a protection diode.

The semiconductor device of the present disclosure is configured to have an oxide film having a thickness with which the electrical connection between the lower electrode and the upper electrode of a multilayer electrode is maintained at the interface of thereof and having a thickness with which epitaxial growth is inhibited at the interface between the substrate and the diode electrode.

Specifically, the semiconductor device of the present disclosure includes: memory cells formed in a memory cell region of a substrate, each of the memory cells having a first multilayer electrode including a first lower electrode made of a first conductive film and a first upper electrode made of a second conductive film formed one on the other with a first interface film as a silicon oxide film interposed therebetween; and a diode formed in a diode region of the substrate, the diode including a diode electrode made of the second conductive film and a second interface film as the silicon oxide film formed at the interface between the diode electrode and the substrate, wherein the first interface film has a thickness with which electrical connection between the first lower electrode and the first upper electrode is maintained, and the second interface film has a thickness with which epitaxial growth between the substrate and the diode electrode is inhibited.

In the semiconductor device described above, conduction can be sufficiently secured between the lower electrode and the upper electrode of the multilayer electrode of the memory cell. Also, no abnormal growth will occur in formation of a polysilicon film on the substrate.

The fabrication method for a semiconductor device of the present disclosure includes the steps of: (a) forming a first insulating film on a memory cell region of a substrate; (b) forming a second insulating film on a diode region of the substrate; (c) forming a first conductive film on the first insulating film and the second insulating film; (d) selectively removing the first conductive film and the first insulating film using a mask insulating film to form a first opening in the memory cell region, and selectively removing the first conductive film and the second insulating film using the mask insulating film to form a second opening exposing the substrate in the diode region; (e) forming a bit line diffusion layer in a region of the substrate exposed in the first opening in the memory cell region; (f) forming a bit line insulating film filling the first opening; (g) removing the mask insulating film and forming a silicon oxide film on the first conductive film and on a region of the substrate exposed in the second opening in the memory cell region and the diode region; and (h) forming a second conductive film on the entire surface in the memory cell region and the diode region, wherein in the step (g), after removal of the mask insulating film, the silicon oxide film is formed by ozone cleaning.

In the fabrication method for a semiconductor device described above, the thickness of the interface films can be precise and uniform. Hence, in the memory cell region, electrical connection between the lower electrode and the upper electrode can be sufficiently secured. In the diode region, no abnormal epitaxial growth will occur between the substrate and the polysilicon film. Also, since the silicon oxide film is formed utilizing cleaning during the removal of the mask insulating film, the thermal budget is prevented from increasing. The number of process steps is also prevented from increasing.

BRIEF DESCRIPTION OF THE DRAWINGS

FIGS. 1A to 1C show a semiconductor device of an embodiment of the present invention, in which FIG. 1A is a cross-sectional view of a memory cell region, FIG. 1B is a cross-sectional view of a diode region and FIG. 1C is a cross-sectional view of a peripheral circuit region.

FIGS. 2A to 2C show a fabrication process step for the semiconductor device of the embodiment, in which FIG. 1A is a cross-sectional view of the memory cell region, FIG. 1B is a cross-sectional view of the diode region and FIG. 1C is a cross-sectional view of the peripheral circuit region.

FIGS. 3A to 3C show another fabrication process step for the semiconductor device of the embodiment, in which FIG. 1A is a cross-sectional view of the memory cell region, FIG. 1B is a cross-sectional view of the diode region and FIG. 1C is a cross-sectional view of the peripheral circuit region.

FIGS. 4A to 4C show yet another fabrication process step for the semiconductor device of the embodiment, in which FIG. 1A is a cross-sectional view of the memory cell region, FIG. 1B is a cross-sectional view of the diode region and FIG. 1C is a cross-sectional view of the peripheral circuit region.

FIGS. 5A to 5C show yet another fabrication process step for the semiconductor device of the embodiment, in which FIG. 1A is a cross-sectional view of the memory cell region, FIG. 1B is a cross-sectional view of the diode region and FIG. 1C is a cross-sectional view of the peripheral circuit region.

FIGS. 6A to 6C show yet another fabrication process step for the semiconductor device of the embodiment, in which FIG. 1A is a cross-sectional view of the memory cell region, FIG. 1B is a cross-sectional view of the diode region and FIG. 1C is a cross-sectional view of the peripheral circuit region.

DESCRIPTION OF THE PREFERRED EMBODIMENTS

Figure 1A:
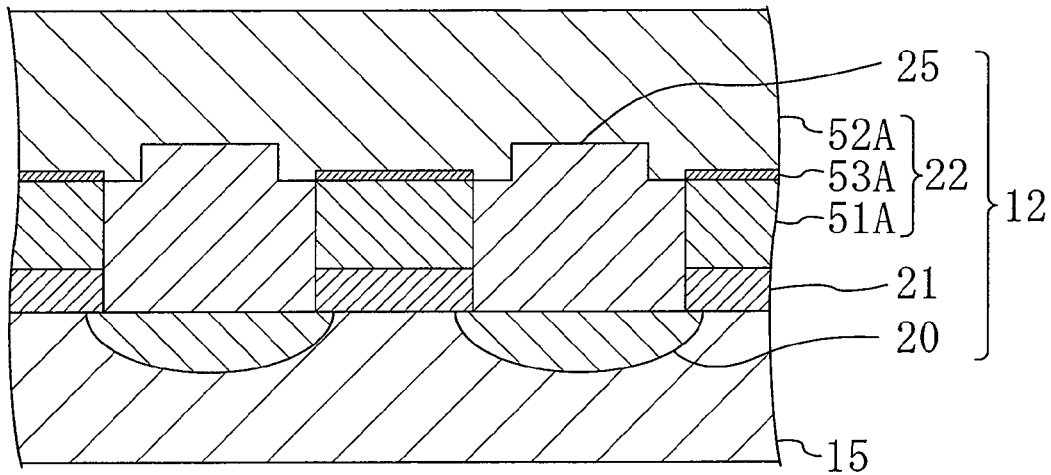
Figure 1B:
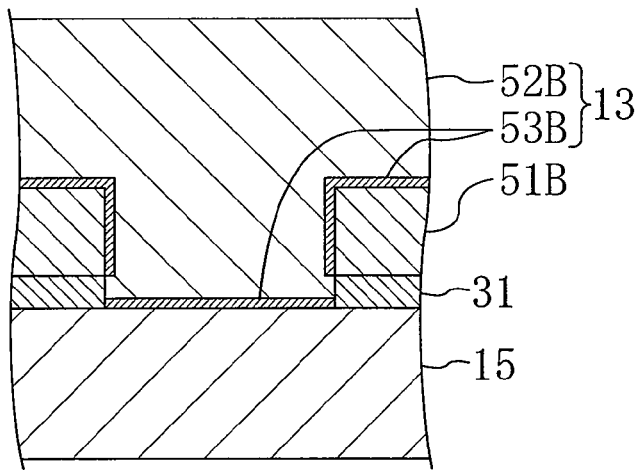
Figure 1C:
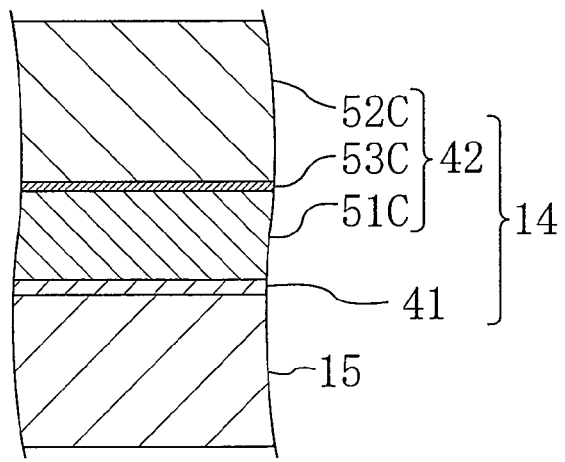

FIGS. 1A to 1C respectively show cross-sectional configurations of a memory cell region, a diode region and a peripheral circuit region of a semiconductor device of an embodiment of the present invention.

As shown in FIGS. 1A to 1C, the semiconductor device of this embodiment includes a memory cell 12 formed in the memory cell region, a protection diode 13 formed in the diode region and a transistor 14 formed in the peripheral circuit region.

Referring to FIG. 1A, in the memory cell region, a plurality of bit line diffusion layers 20 extending in a first direction with space therebetween are formed in a top portion of a semiconductor substrate 15 of a first conductivity type. A first gate insulating film 21 is formed on the region of the semiconductor substrate 15 located between any adjacent bit line diffusion layers 20. The first gate insulating film 21 is an ONO film having a silicon oxide film, a silicon nitride film and a silicon oxide film sequentially formed one upon another. A first gate electrode 22 is formed on the first gate insulating film 21. The first gate electrode 22 is a multilayer electrode having a lower electrode 51A made of a first polysilicon film and an upper electrode 52A made of a second polysilicon film formed one upon the other. A first interface film 53A as a silicon oxide film is formed at the interface between the lower electrode 51A and the upper electrode 52A. The upper electrode 52A serves as a word line extending in a second direction perpendicular to the first direction in which the bit line diffusion layers 20 extend. A bit line insulating film 25 is formed on each of the bit line diffusion layers 20 in the semiconductor substrate 15 for filling the space between the adjacent lower electrodes 51A. The height of the bit line insulating film 25 is made greater than the height of the lower electrode 51A, and the upper portion of the bit line insulating film 25 with respect to the top surface of the lower electrode 51A is made narrower than the remaining lower portion thereof.

Referring to FIG. 1B, in the diode region, a lower polysilicon film 51B made of the first polysilicon film is formed on the semiconductor substrate 15 with an insulating film 31 interposed therebetween. The insulating film 31 and the lower polysilicon film 51B have an opening exposing the semiconductor substrate 15. A diode electrode 52B made of the second polysilicon film is formed on the lower polysilicon film 51B so as to fill the opening. A second interface film 53B as the silicon oxide film is formed at the interface between the diode electrode 52B and the lower polysilicon film 51B and the interface between the diode electrode 52B and the semiconductor substrate 15.

Referring to FIG. 1C, in the peripheral circuit region, a second gate electrode 42 is formed on the semiconductor substrate 15 with a second gate insulating film 41 interposed therebetween. The second gate electrode 42 is a multilayer electrode having a lower electrode 51C made of the first polysilicon film and an upper electrode 52C made of the second polysilicon film formed one upon the other with a third interface film 53C as the silicon oxide film therebetween. Source/drain diffusion layers (not shown) are formed appropriately in the portions of the semiconductor substrate 15 located on both sides of the second gate electrode 42. Also, a sidewall and the like (not shown) may be formed on the side faces of the second gate electrode 42 as required.

Figure 2A:
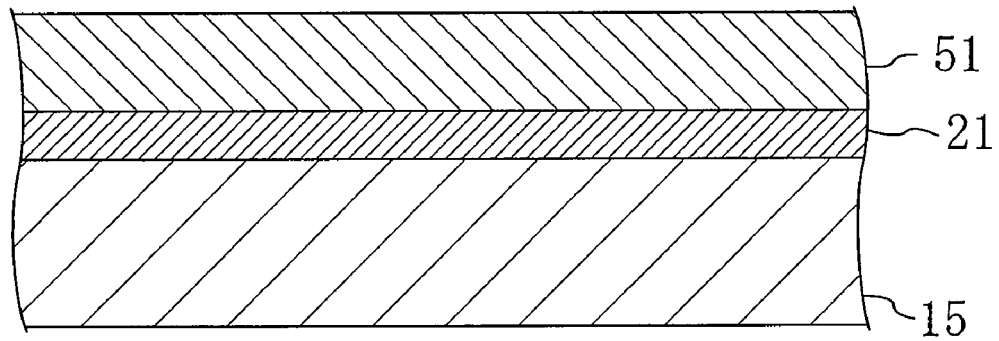
Figure 2B:
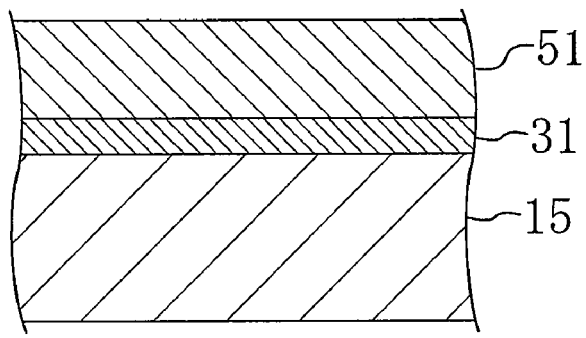
Figure 2C:
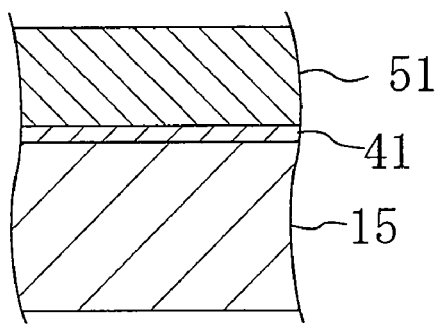

Hereinafter, a fabrication method for the semiconductor device of this embodiment will be described with reference to the relevant drawings. Note that FIGS. 2A, 3A, 4A, 5A and 6A show the cross-sectional structure of the memory cell region, FIGS. 2B, 3B, 4B, 5B and 6B show the cross-sectional structure of the diode region, and FIGS. 2C, 3C, 4C, 5C and 6C show the cross-sectional structure of the peripheral circuit region First, as shown in FIGS. 2A to 2C, the first gate insulating film 21 as an ONO film is formed on the memory cell region of the semiconductor substrate 15, the insulating film 31 is formed on the diode region thereof, and the second gate insulating film 41 is formed on the peripheral circuit region thereof. Subsequently, a first polysilicon film 51 is formed on the entire surface of the semiconductor substrate 15.

The first gate insulating film 21, the insulating film 31 and the second gate insulating film 41 can be formed in various ways. They may however be formed efficiently in the following manner.

A silicon oxide film and a silicon nitride film are first formed on the entire surface of the semiconductor substrate 15, and then the portions of the silicon oxide film and the silicon nitride film other than those formed in the memory cell region are selectively removed by wet etching. Subsequently, a second silicon oxide film is formed on the entire surface of the semiconductor substrate 15.

As a result, while the first gate insulating film 21 as an ONO film is formed in the memory region, the insulating film 31 and the second gate insulating film 41 as a silicon oxide film are formed in the diode region and the peripheral circuit region, respectively. The insulating film 31 may otherwise be the same ONO film as the first gate insulating film 21.

When a difference is given in thickness between the insulating film 31 and the second gate insulating film 41, a general multiple gate oxide film formation method as follows may be adopted. That is, after the formation of the second silicon oxide film on the semiconductor substrate 15, the portion of the second silicon oxide film formed in the peripheral circuit region is selectively removed. Thereafter, a third silicon oxide film is formed. With this, the insulating film 31 can be made thicker than the second gate insulating film 41. The removal of the second silicon oxide film may also be made for the memory cell region.

In the semiconductor device of this embodiment, the first gate insulating film 21 had a silicon oxide film having a thickness of 5 nm, a silicon nitride film having a thickness of 5 nm and a silicon oxide film having a thickness of 10 nm formed one upon another sequentially in this order. The insulating film 31 had a silicon oxide film having a thickness of 15 nm. The second gate insulating film 41 had a silicon oxide film having a thickness of 3 nm. The thickness of the first polysilicon film was 50 nm.

Figure 3A:
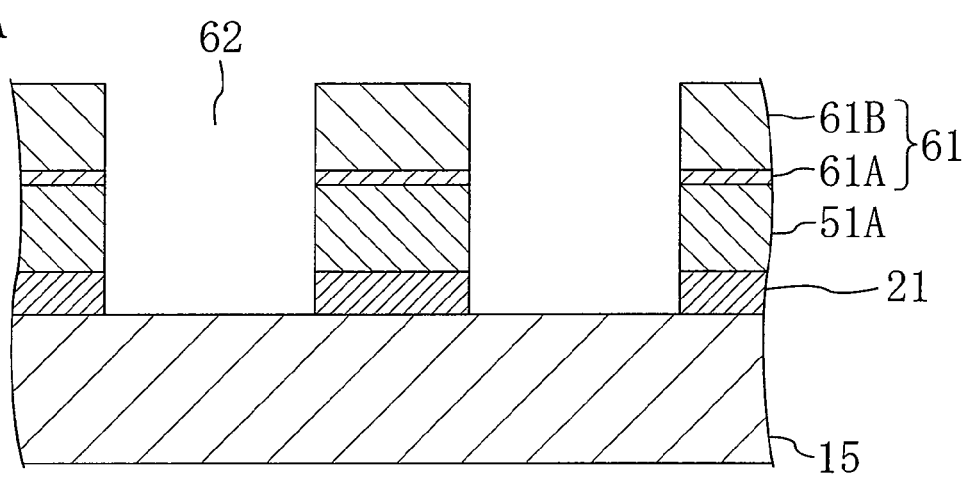
Figure 3B:
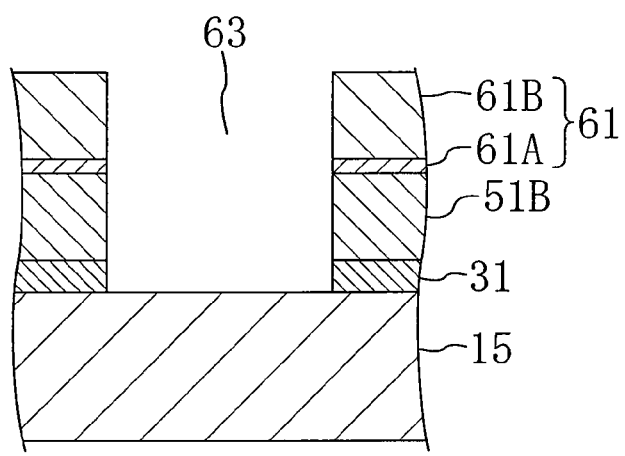
Figure 3C:
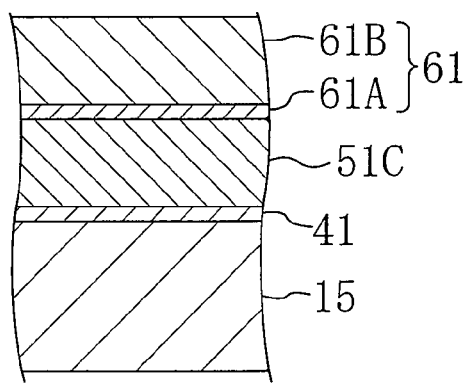

As shown in FIGS. 3A to 3C, a mask insulating film 61 is formed on the entire surface of the semiconductor substrate 15, and then selectively patterned by photolithography in the memory cell region and the diode region. Using the patterned mask insulating film 61 as a mask, the first polysilicon film 51, the first gate insulating film 21 and the insulating film 31 are patterned. By this patterning, the lower electrodes 51A made of the first polysilicon film are formed in the memory cell region, with a first opening 62 exposing the semiconductor substrate 15 being formed between any adjacent lower electrodes 51A. In the diode region, the lower polysilicon films 51B are formed, with a second opening 63 exposing the semiconductor substrate 15 being formed between any adjacent lower polysilicon films 51B. In the semiconductor device of this embodiment, the mask insulating film 61 was provided as a multilayer film having a mask oxide film 61A made of a silicon oxide film having a thickness of 10 nm and a mask nitride film 61B made of a silicon nitride film having a thickness of 100 nm.

Figure 4A:
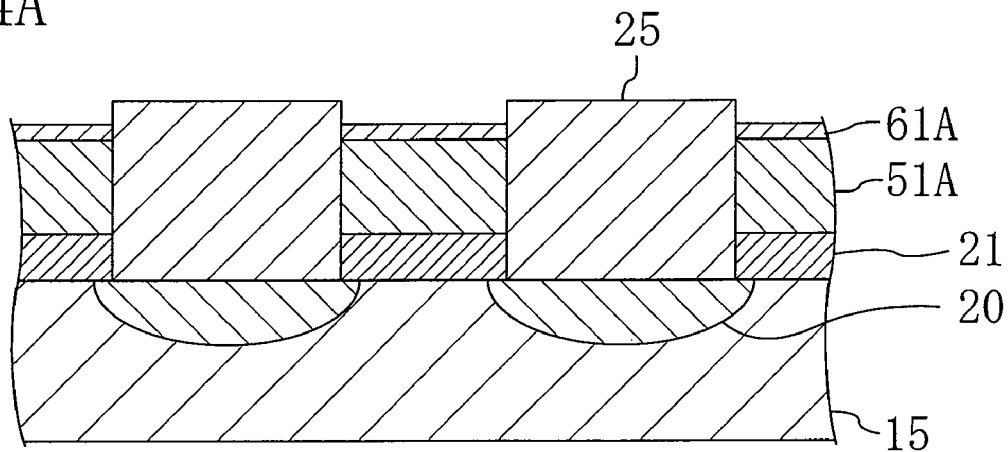
Figure 4B:
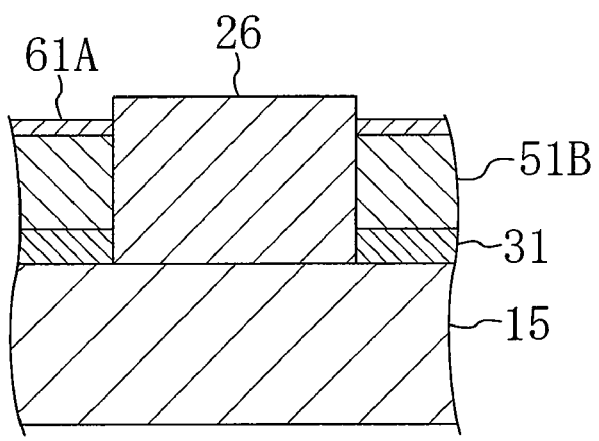
Figure 4C:
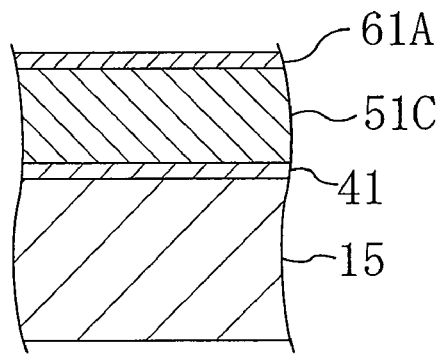

As shown in FIGS. 4A to 4C, in the memory cell region, an impurity is introduced into the portions of the semiconductor substrate 15 exposed in the first openings 62 by ion implantation, to form the bit line diffusion layers 20. The impurity implantation amount is preferably in the order of $1 \times 10^{15}/cm^2$. Thereafter, a silicon oxide film that is to be the bit line insulating films is formed on the entire surface of the semiconductor substrate 15 by CVD, and the formed silicon oxide film is then polished by CMP until the mask nitride film 61B is exposed. The polished silicon oxide film is then subjected to oxide film wet etching so that the top surface thereof is higher than the top surface of the mask oxide film 61A by about 30 nm. Hence, the bit line insulating film 25 that fills each of the first opening 62 and protrudes from the lower electrode 51A is formed. Subsequently, the mask nitride film 61B is removed by wet etching using phosphoric acid. With the bit line insulating film 25 whose top surface is higher than the top surface of the mask oxide film 61A, the lower electrode 51A can be protected from etching during the removal of the mask nitride film 61B with phosphoric acid. The height of the bit line insulating film 25 may be changed appropriately.

During the above step, the second opening 63 is also filled with a silicon oxide film 26 in the diode region. In the peripheral circuit region, no silicon oxide film is left unremoved.

Figure 5A:
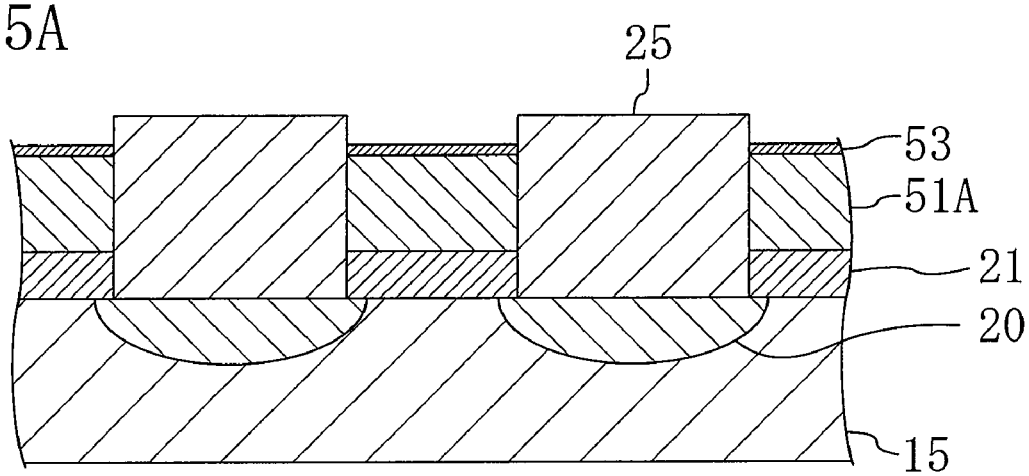
Figure 5B:
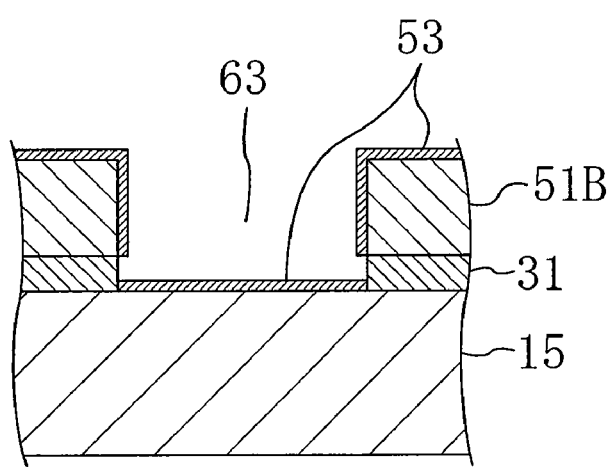
Figure 5C:
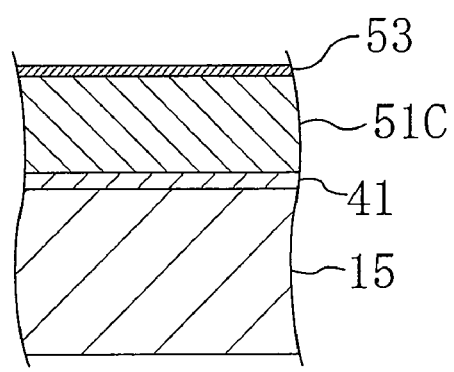

As shown in FIGS. 5A to 5C, in the diode region, the silicon oxide film 26 filling the second opening 63 is removed by dry etching. In this etching, a $CF_4$ or $CHF_3$ etching gas is preferably used. The entire surface of the semiconductor substrate 15 is then subjected to oxide film wet etching to remove the remaining mask oxide film 61A. The oxide film wet etching is terminated with ozone cleaning, so that a silicon oxide film 53 having a thickness of about 1 nm is formed on the first polysilicon film 51 and the exposed portion of the semiconductor substrate 15 in the second opening 63. Since the formation of the silicon oxide film by ozone cleaning is good in controllability, the thickness of the resultant silicon oxide film 53 can be uniform and precise.

Figure 6A:
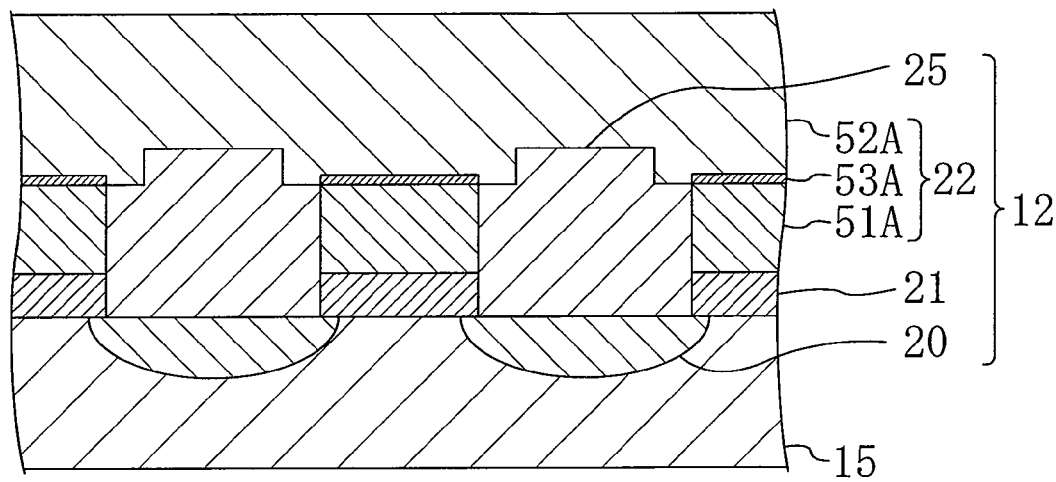
Figure 6B:
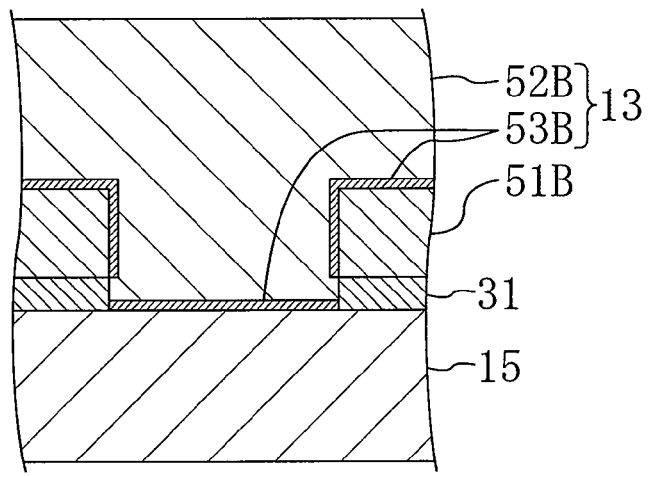
Figure 6C:
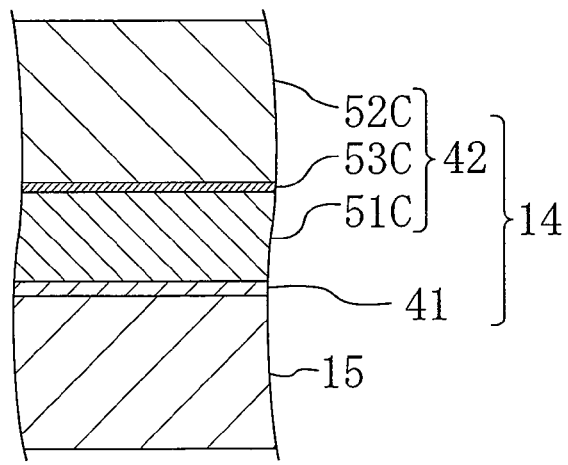

As shown in FIGS. 6A to 6C, a second polysilicon film having a thickness of 150 nm is formed on the entire surface of the semiconductor substrate 15 and then selectively etched. As a result, in the memory cell region, formed is the first gate electrode 22 as a multilayer electrode having the lower electrode 51A made of the first polysilicon film and the upper electrode 52A made of the second polysilicon film placed one on the other. In the diode region, the diode electrode 52B made of the second polysilicon film is formed. In the peripheral circuit region, formed is the second gate electrode 42 as a multilayer electrode having the lower electrode 51C made of the first polysilicon film and the upper electrode 52C made of the second polysilicon film placed one on the other.

The first interface film 53A as the silicon oxide film existing at the interface between the lower electrode 51A and the upper electrode 52A has a thickness of 1 nm. Hence, the conduction between the lower electrode 51A and the upper electrode 52A can be secured. Also, since the thickness of the first interface film 53A is uniform, the threshold voltage and the resistance value are prevented from varying. The second interface film 53B as the silicon oxide film existing at the interface between the semiconductor substrate 15 and the diode electrode 52B also has a thickness of 1 nm. Hence, no abnormal epitaxial growth will occur between the semiconductor substrate 15 and the diode electrode 52B.

The subsequent fabrication process steps are not specifically illustrated, but after working on the multilayer electrodes and formation of the word lines, the diode electrodes and the transistor electrodes, process steps of forming silicide, forming contacts and routing follow to complete the semiconductor device.

Note that having been subjected to the oxide film wet etching for removing the mask oxide film 61A, the portion of the bit line insulating film 25 protruding from the lower electrode 51A inevitably becomes narrower than the other portion thereof below the top surface of the lower electrode 51A. Also, with no use of thermal oxidation for formation of the first interface film 53A, the corners of the top portion of the lower electrode 51A are inevitably in an acute shape.

From the studies by the present inventors, it has been confirmed that if the thickness of the second interface film 53B is less than 0.7 nm, abnormal epitaxial growth will occur between the semiconductor substrate 15 and the second polysilicon film. Also confirmed has been that if the thickness of the third interface film 53C exceeds 1.5 nm, the capacitance value will increase by 50% or more when the thickness of the second gate insulating film 41 is 3 nm, causing significant degradation in the driving force of transistors in the peripheral circuit region. Likewise, if the thickness of the first interface film 53A exceeds 1.5 nm, degradation in the driving force of transistors in the memory cell region will occur to one degree or another. For example, when the thickness of the first gate insulating film 21 is 15 nm, degradation in driving force of about 10% will occur.

A silicon oxide film formed by CVD will have a thickness of several nanometers. Hence, if a CVD method is used in place of the ozone cleaning described above to form the first interface film 53A, the second interface film 53B and the third interface film 53C, the thickness of the third interface film 53C will exceed 1.5 nm degrading the driving force of transistors.

If a natural oxide film is used, the thermal budget will increase inversely affecting the element characteristics. Also, since control of the film thickness is difficult, the second interface film 53B may become very thin, possibly causing abnormal epitaxial growth between the semiconductor substrate 15 and the second polysilicon film.

If cleaning with an ammonia hydrogen peroxide mixture (APM) is performed in the oxide film wet etching to form a chemical oxide film, the second interface film 53B may become thin as in the case of the natural oxide film, possibly causing abnormal epitaxial growth. This also has a demerit of increasing the roughness of the underlying film. If a sulfuric acid hydrogen peroxide mixture (SPM) and nitric acid are used to form a chemical oxide film, in which the oxidation is very powerful, the difference in film thickness between the first and third interface films 53A and 53C and the second interface film 53B will be large. The reason for this is as follows. While the first and third interface films 53A and 53C are formed on the polysilicon film, the second interface film 53B is formed on the substrate. Hence, under processing with nitric acid and the like high in oxidation power, the first and third interface films are faster in oxidation and therefore thicker than the second interface film. As a result, if the thickness of the second interface film 53B is fixed, the thickness of the first and third interface films 53A and 53C will be great, increasing the degradation in the driving force of transistors in the memory cell region and the peripheral circuit region.

In this embodiment, ozone cleaning is adopted to form the first and third interface films 53A and 53C. Hence, even after pre-furnace cleaning prior to the formation of the second polysilicon film, variations in the thickness of the first and third interface films 53A and 53C can be within 1 nm±0.3 nm. In this way, since a thin silicon oxide film whose variations in thickness are very small can be formed, neither abnormal epitaxial growth nor degradation in driving force will occur. Moreover, since the ozone cleaning is performed as the final processing in the originally required oxide film wet etching step, the silicon oxide film can be attained in a very simple manner without increase in thermal budget or the number of process steps.

As described above, the semiconductor device of the embodiment and the fabrication method for the same, in which an oxide film having a uniform and optimal thickness can be formed at the interface between the lower electrode and the upper electrode of each memory cell and the interface between the substrate and the diode electrode of each protection diode, are especially useful as a semiconductor device having memory cells and protection diodes and a fabrication method for such a semiconductor device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
    memory cells formed in a memory cell region of a substrate, each of the memory cells having a first multilayer electrode including a first lower electrode made of a first conductive film and a first upper electrode made of a second conductive film formed one on the other with a first interface film as a silicon oxide film interposed therebetween; and
    a diode formed in a diode region of the substrate, the diode including a diode electrode made of the second conductive film and a second interface film as the silicon oxide film formed at the interface between the diode electrode and the substrate,
    wherein the first interface film has a thickness with which electrical connection between the first lower electrode and the first upper electrode is maintained, and the second interface film has a thickness with which epitaxial growth between the substrate and the diode electrode is inhibited.

2. The device of claim 1, wherein the first interface film and the second interface film have an equal thickness.

3. The device of claim 1, wherein the first interface film and the second interface film have a thickness within a range of about 0.7 nm to about 1.3 nm inclusive.

4. The device of claim 1, further comprising:
    peripheral transistors formed in a peripheral circuit region of the substrate, each of the peripheral transistors having a second multilayer electrode including a second lower electrode made of the first conductive film and a second upper electrode made of the second conductive film formed one on the other with a third interface film as the silicon oxide film interposed therebetween.

5. The device of claim 1, wherein the memory cell comprises:
    a bit line diffusion layer formed in a region of the substrate located between the adjacent first multilayer electrodes, the bit line diffusion layer being shared by the adjacent first multilayer electrodes; and
    a bit line insulating film formed on the bit line diffusion layer, and
    the bit line insulating film is greater in height than the first lower electrode, and an upper portion of the bit line insulating film with respect to the top surface of the first lower electrode is narrower than a lower portion thereof.

6. The device of claim 1, wherein corners of a top portion of the first lower electrode are in an acute shape.

* * * * *